United States Patent [19]

Tanaka et al.

[11] Patent Number: 5,352,942
[45] Date of Patent: Oct. 4, 1994

[54] GATE ARRAY SEMICONDUCTOR CIRCUIT DEVICE, INPUT CIRCUIT, OUTPUT CIRCUIT AND VOLTAGE LOWERING CIRCUIT

[75] Inventors: Yasunori Tanaka, Yokohama; Toshikazu Sei, Kawasaki; Teruo Kobayashi, Tokyo; Kaoruko Yamada, Yokohama, all of Japan

[73] Assignee: Kabushiki Kaisha Toshiba, Kawasaki, Japan

[21] Appl. No.: 825,516

[22] Filed: Jan. 24, 1992

[30] Foreign Application Priority Data

Jan. 29, 1991 [JP] Japan .................. 3-026685

[51] Int. Cl.⁵ ............... H03K 19/0175; H03K 19/003
[52] U.S. Cl. .................... 307/475; 307/443; 307/446
[58] Field of Search ............ 307/465, 446, 475, 443, 307/296.6, 456

[56] References Cited

U.S. PATENT DOCUMENTS

| | | | |
|---|---|---|---|
| 4,301,383 | 11/1981 | Taylor | 307/446 |
| 4,438,352 | 3/1984 | Mardkha | 307/475 |
| 4,477,740 | 10/1984 | Takeda | 307/443 |
| 4,527,079 | 6/1985 | Thompson | 307/443 |
| 4,574,273 | 3/1986 | Atsumi et al. | 307/443 |
| 4,585,955 | 4/1986 | Uchida | 307/443 |
| 4,721,867 | 1/1988 | Headen, Jr. et al. | 307/456 |
| 4,730,132 | 3/1988 | Watanabe et al. | 307/446 |
| 4,837,461 | 6/1989 | Kubosawa et al. | 307/465 |
| 4,851,715 | 7/1989 | Strong | 307/456 |
| 4,890,017 | 12/1989 | Masuda et al. | 307/451 |
| 4,926,069 | 5/1990 | Yamazaki | 307/446 |
| 4,972,100 | 11/1990 | Lim et al. | 307/451 |
| 4,990,802 | 2/1991 | Smooha | 307/451 |

*Primary Examiner*—Edward P. Westin
*Assistant Examiner*—Jon Santamauro
*Attorney, Agent, or Firm*—Finnegan, Henderson, Farabow, Garrett & Dunner

[57] ABSTRACT

A gate array chip is supplied with an operation voltage of 5V. A logic circuit formed of gate arrays in a chip is operated on an operation voltage of 3.3V. The potential of 3.3V is derived by lowering the potential of 5V by use of a voltage lowering circuit disposed in the chip. A level shifter and a converter are disposed in an I/O peripheral circuit to shift the signal level by use of the chip external signal and chip internal signal so that a signal of 5V amplitude can be input or output.

19 Claims, 13 Drawing Sheets

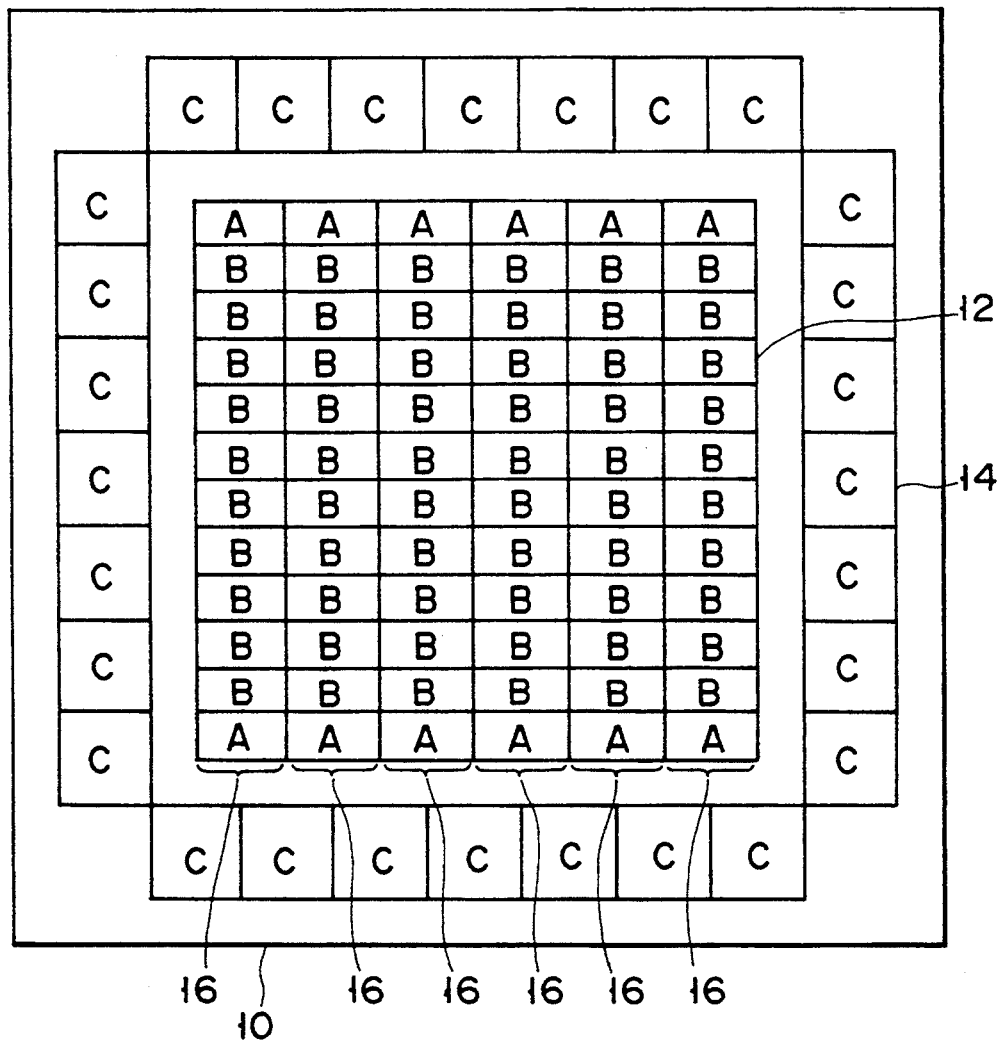
F I G. 1

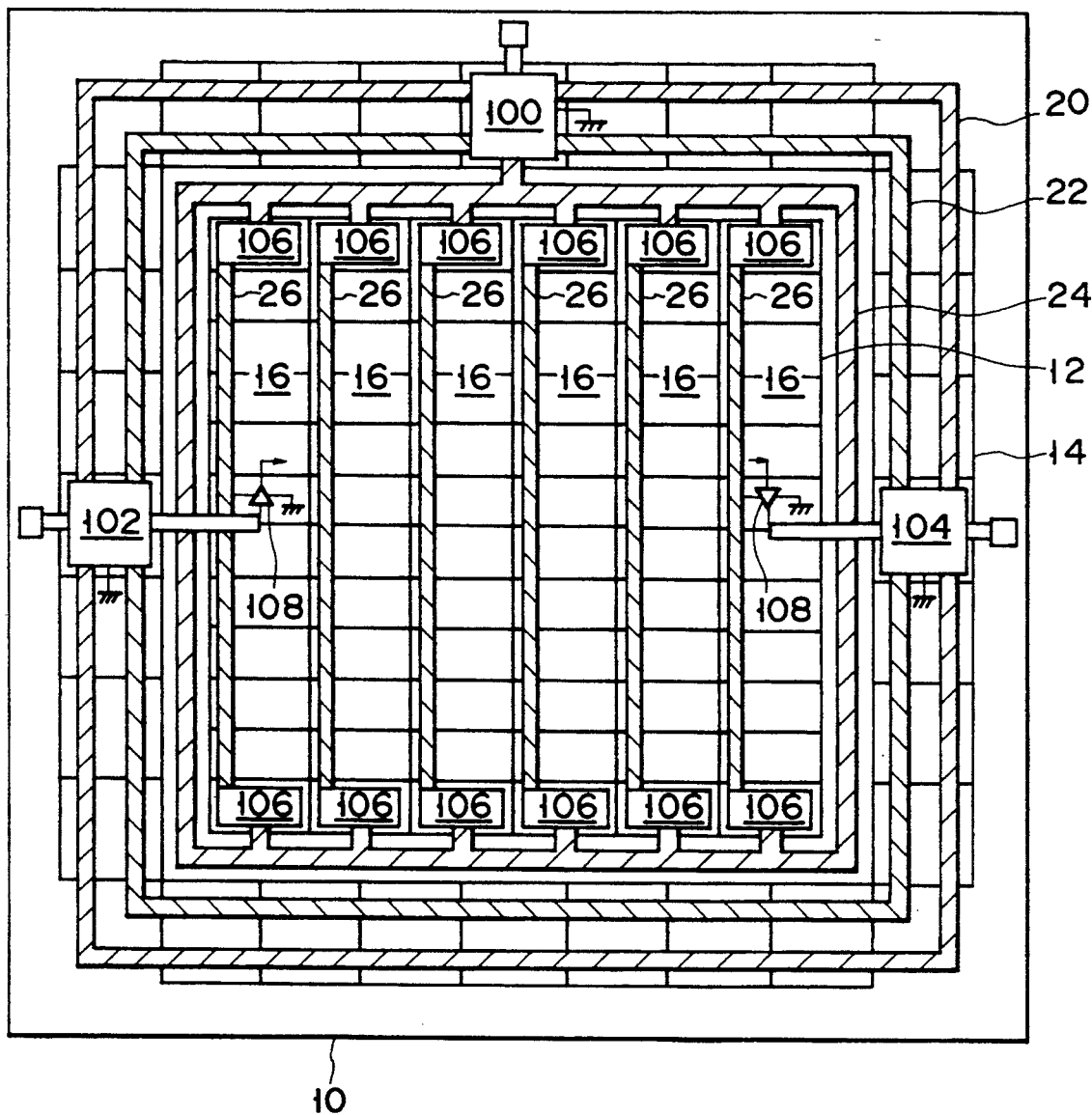
F I G. 2

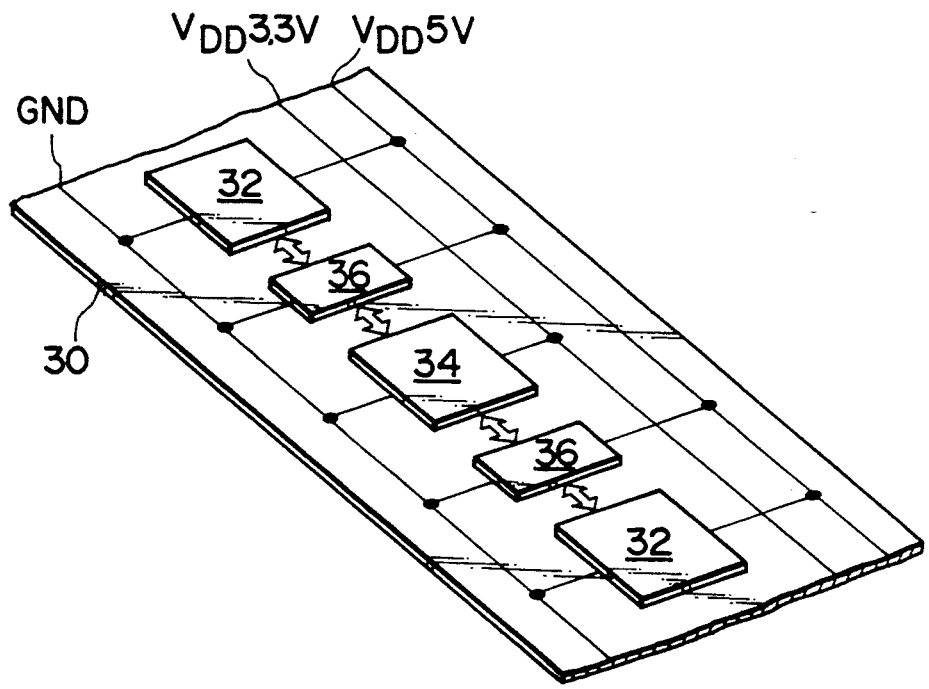
F I G. 3A
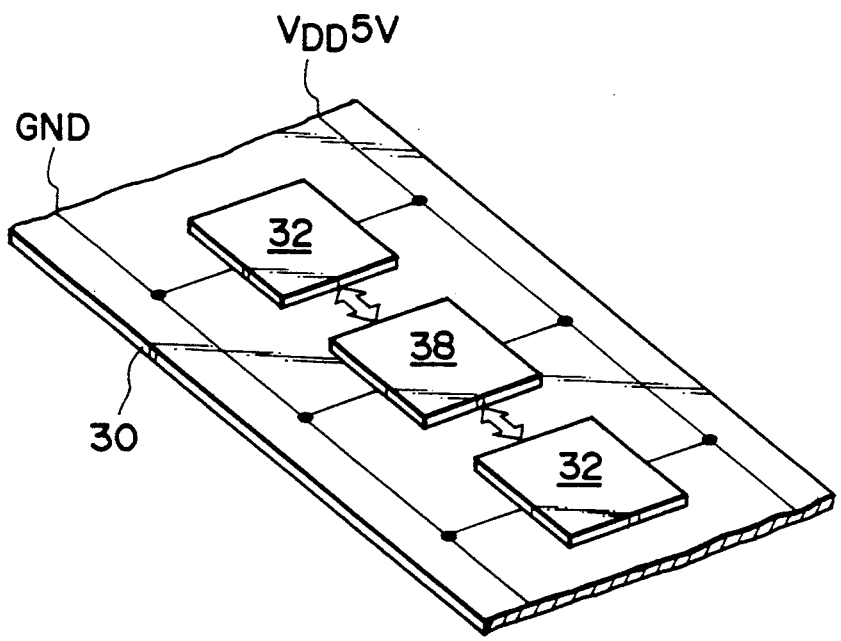
F I G. 3B

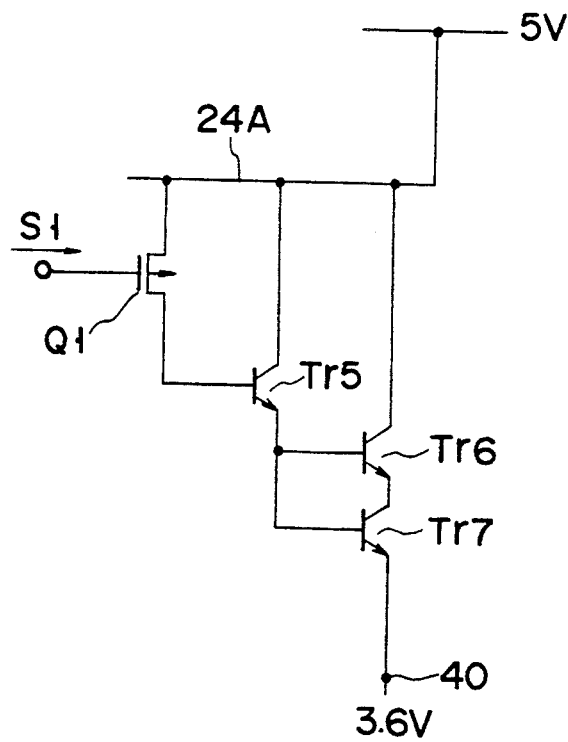
F I G. 5
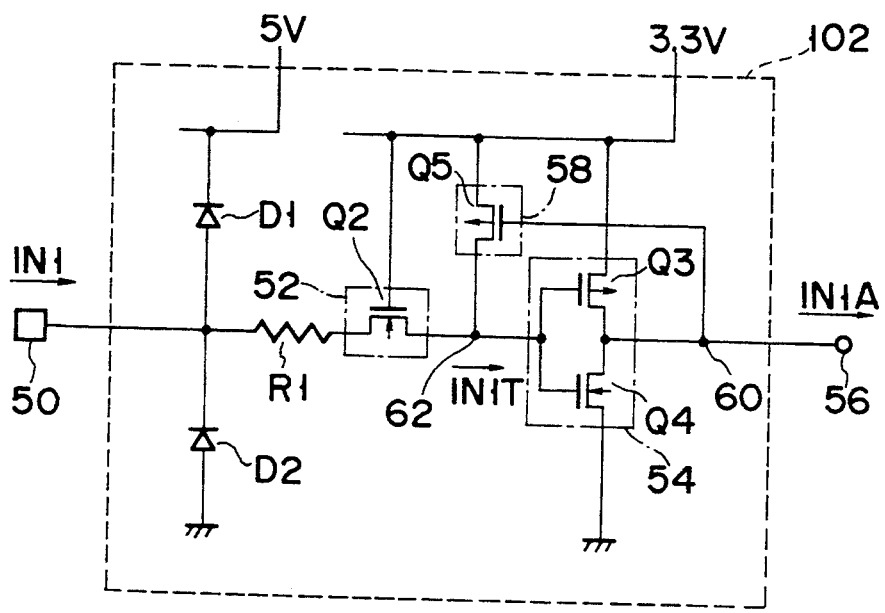
F I G. 6

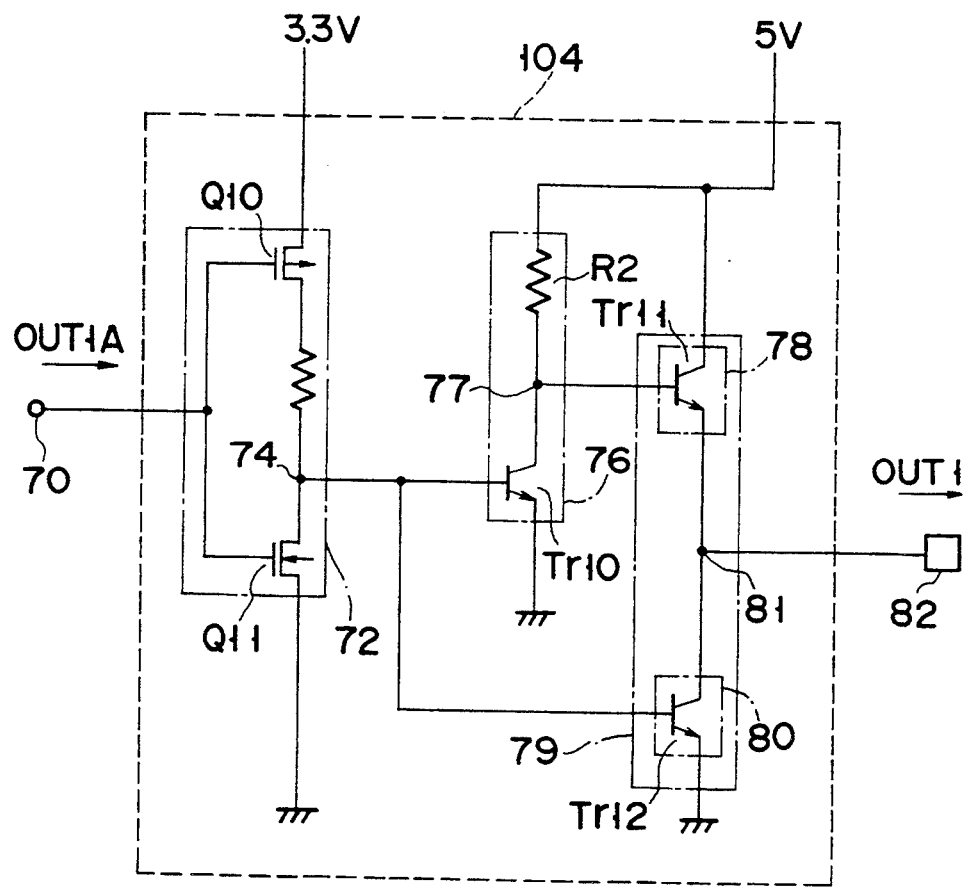
F I G. 7

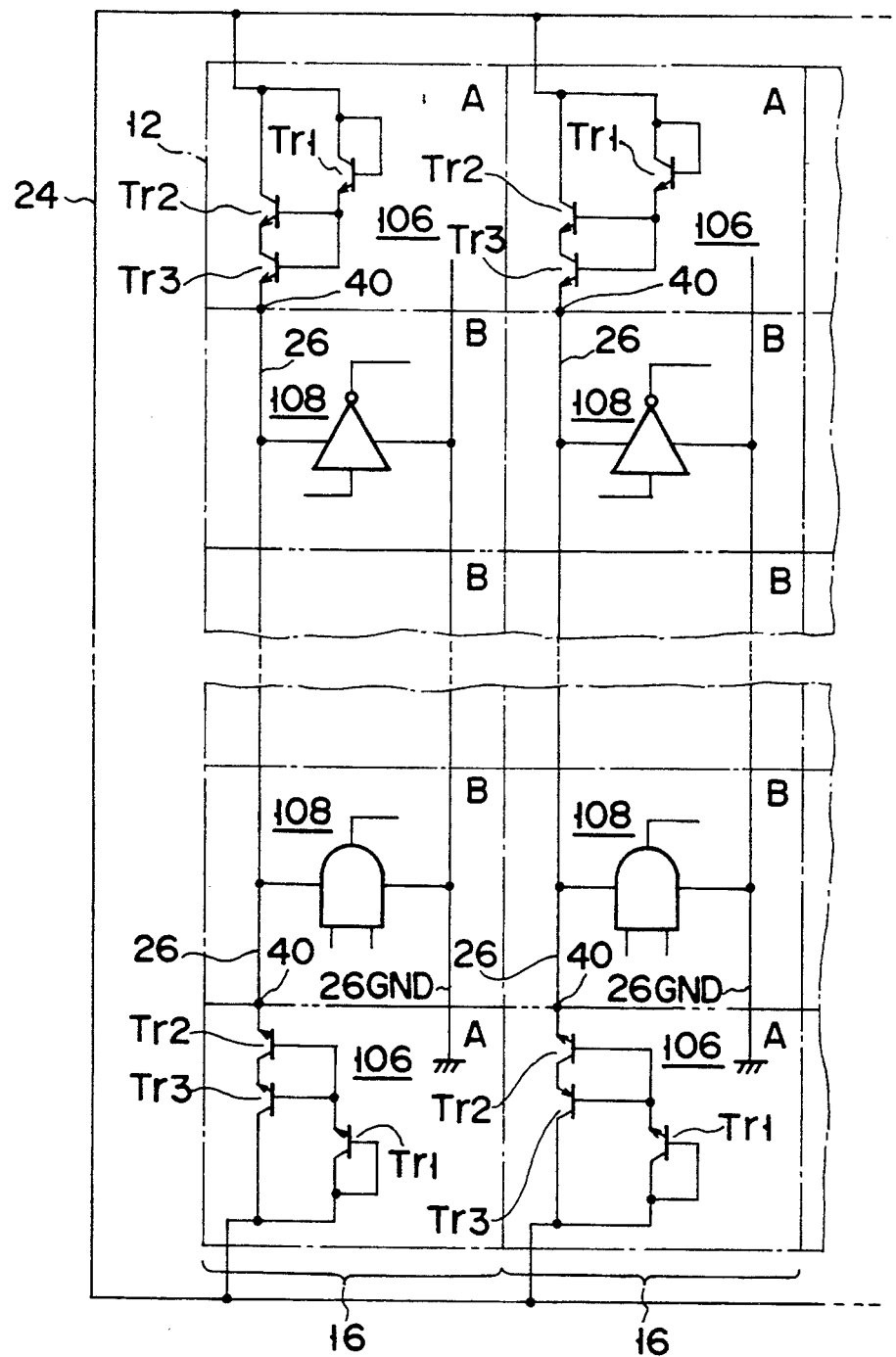
F I G. 9

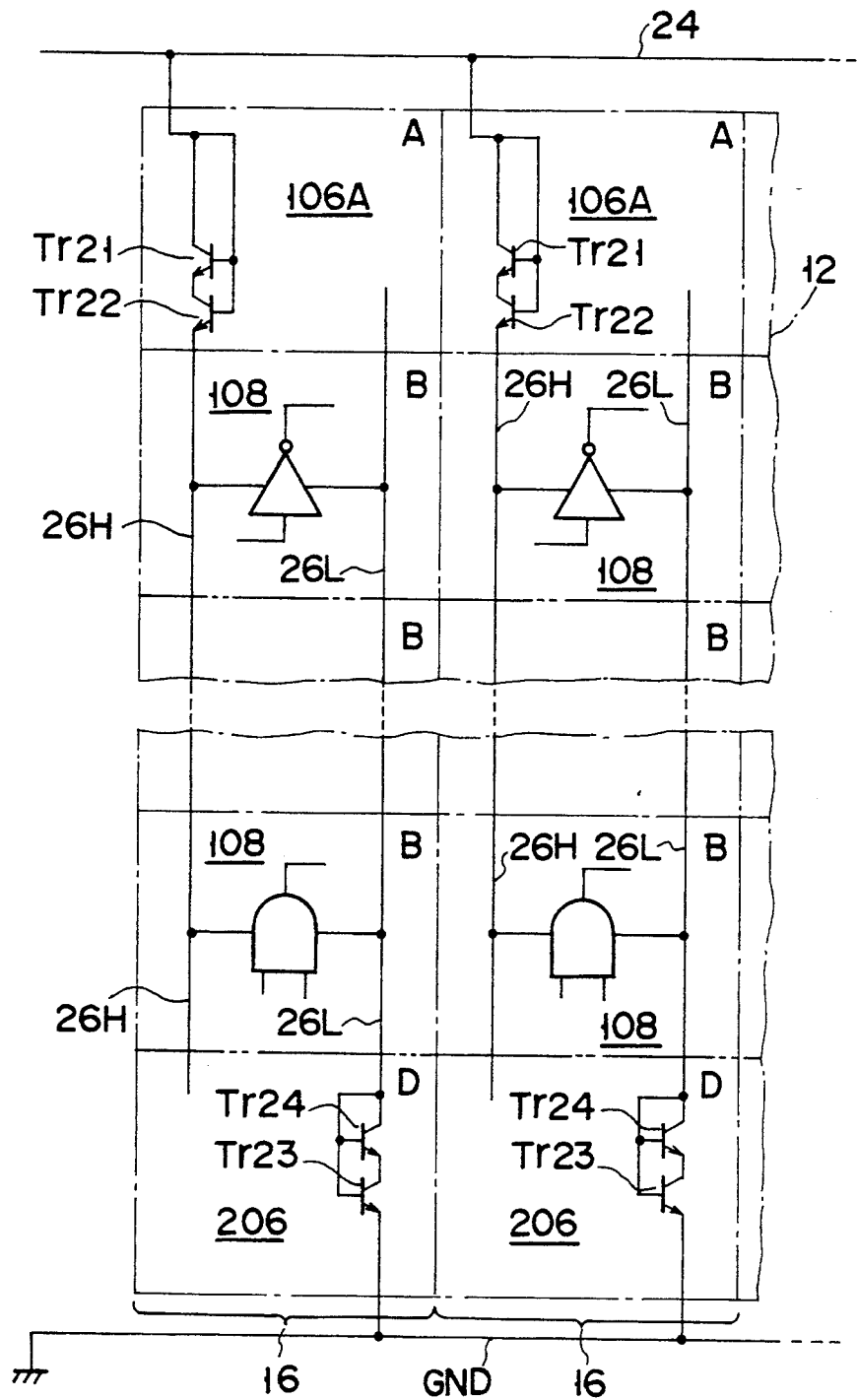
F I G. 10

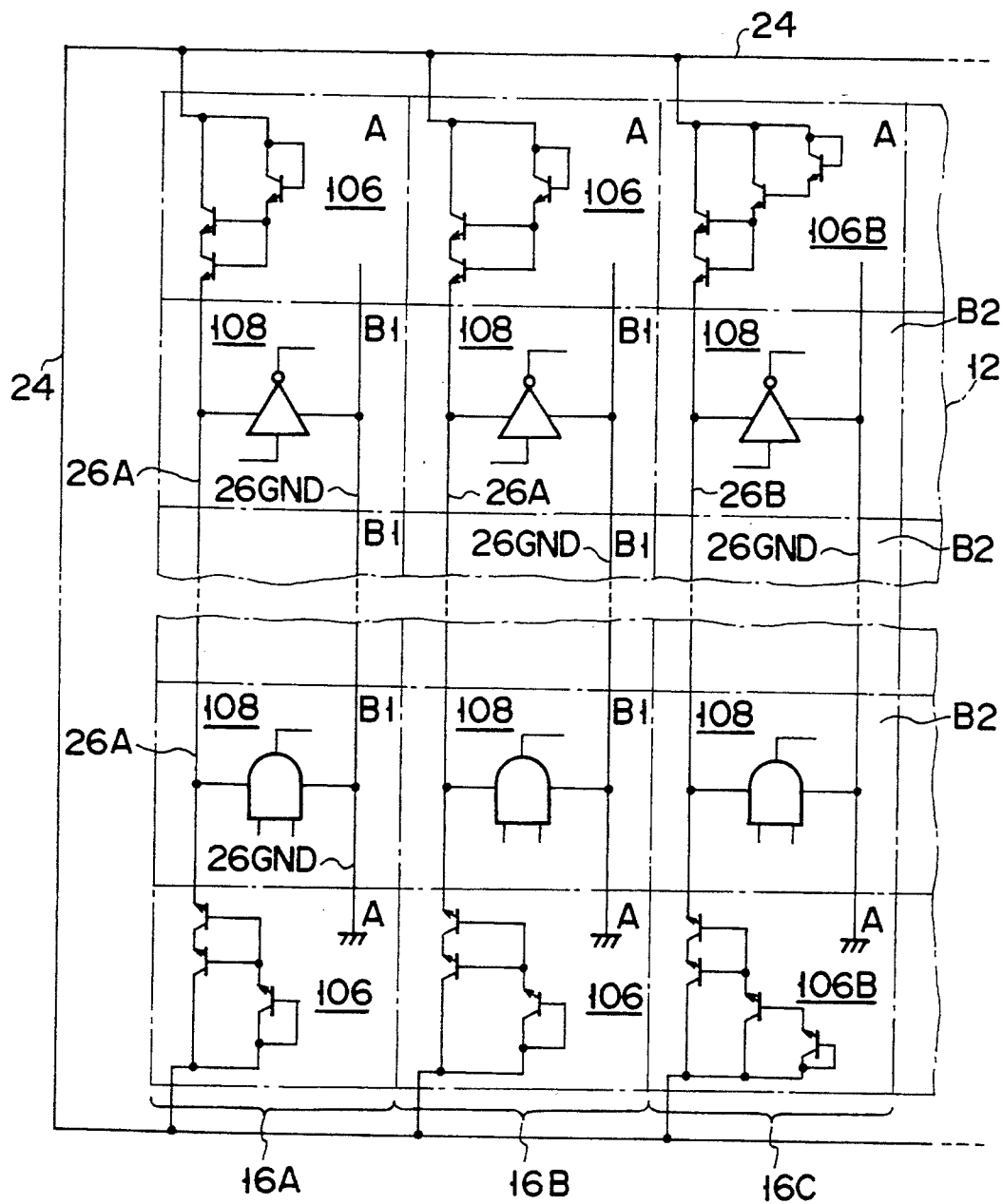
F I G. 11

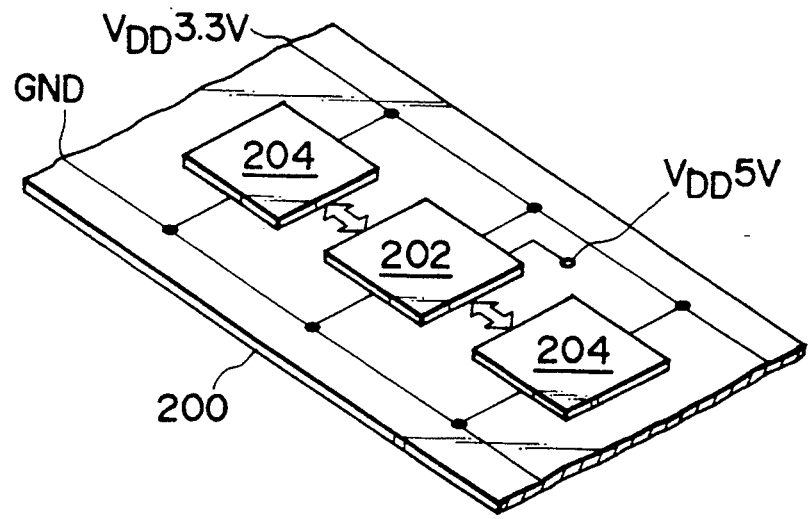
F I G. 13
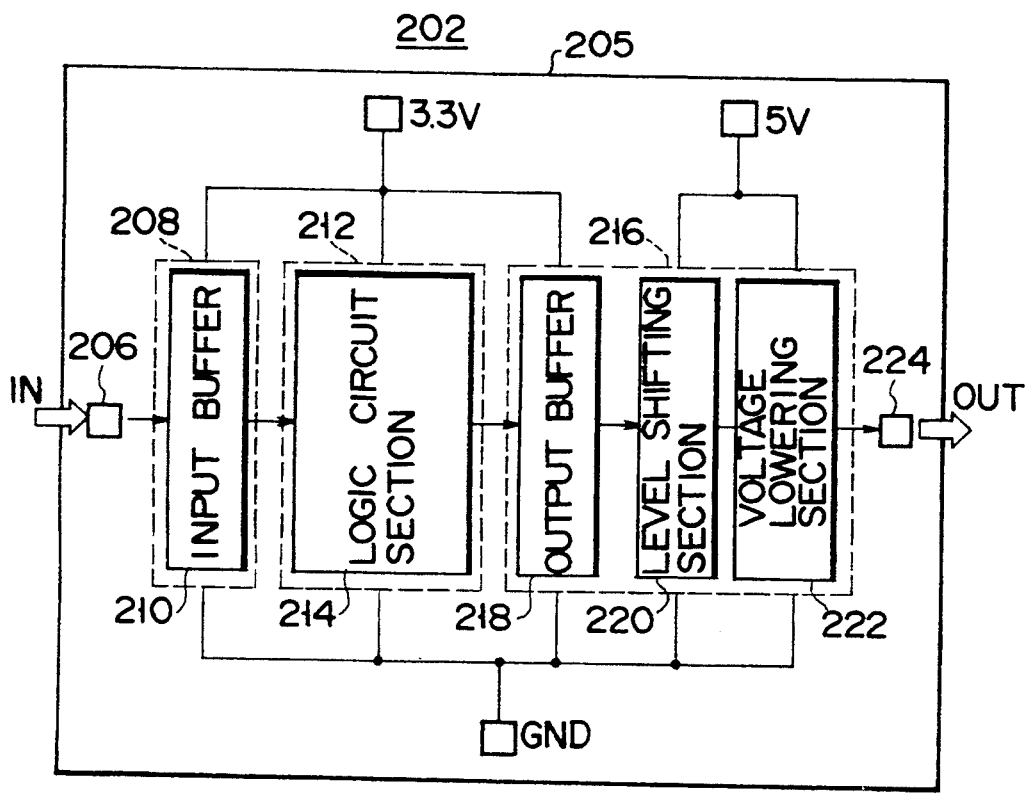
F I G. 14

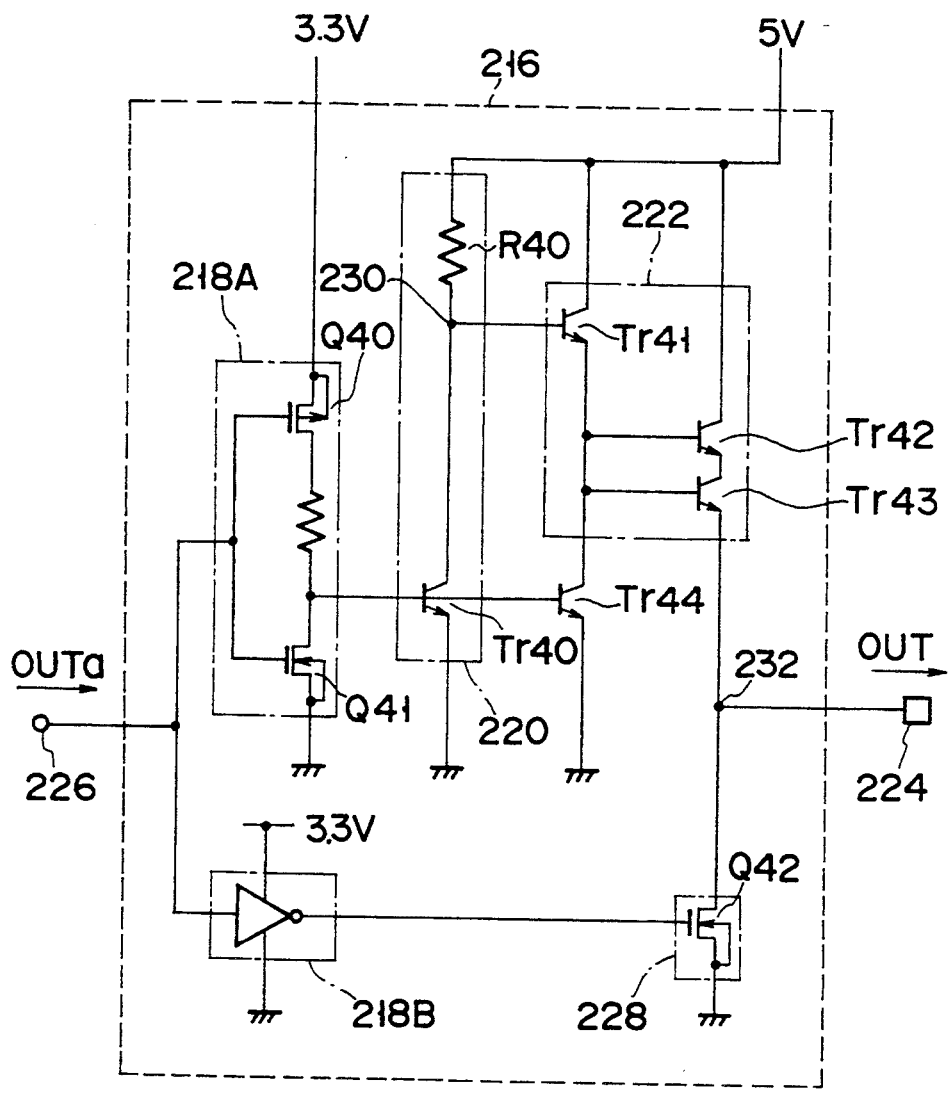
F I G. 15

GATE ARRAY SEMICONDUCTOR CIRCUIT DEVICE, INPUT CIRCUIT, OUTPUT CIRCUIT AND VOLTAGE LOWERING CIRCUIT

BACKGROUND OF THE INVENTION

1. Field of the Invention

This invention relates to a gate array device, and more particularly to reduction in the voltage in a gate array device.

2. Description of the Related Art

Conventionally, requirements for lowering an operation voltage of an integrated circuit (IC) have become stronger with the formation of elements of even greater miniaturization and chips of lower power consumption. As the voltage lowering method, a method of previously lowering a voltage (from 5V to 3.3V) supplied from the exterior of the IC is used.

In the IC chip, it is seldom that the operation frequencies of circuit portions are set at the same frequency, and a circuit portion for effecting the high-speed operation and a circuit portion for effecting the low-speed operation are formed on the same chip. Since the operation speed and power of the circuit vary in proportion to the power source voltage, it is most efficient and ideal to supply an operation voltage corresponding to the operation speed to the circuit.

However, the above method has a defect that the power source system may become complicated and is not practical. In practice, all of the circuits are operated at a constant voltage by use of a single power source, and particularly, in an ASIC such as a gate array designed according to the user's specification, it is a common practice to operate them by a single power source.

With the conventional system using a single power source, two or more power source voltages are necessary and the power source voltage supplying system becomes complicated when an IC operated on an operation voltage of 5V and an IC operated on an operation voltage of 3.3V are formed on one board (system). An interface for voltage conversion from 5V to 3.3V or from 3.3V to 5V must be provided between the ICs, and particularly, the design of the input and output sections of the chip operated on 3.3V becomes difficult.

In order to lower the power consumption of the chip, it may be best to lower the operation voltage for a circuit portion operated at a low speed since in this case the power consumption can be lowered without degrading the system performance. However, with the conventional method of using a single lowered operation voltage and supplying the lowered voltage to the chip, the operation speeds of all of the circuits are lowered according to reduction in the operation voltage and therefore the performance thereof will be degraded.

It is reported that, in order to solve the above problems, a voltage lowering circuit is incorporated in the custom products and only part of the circuits are operated on the lowered voltage. However, a method or system which is particularly effective for gate arrays in which the diffusion process is fixed and the circuit is determined according to the user's specification is not yet reported. Further, in the present custom products, a method of changing the operation voltage according to the operation speed of the circuit is not yet sufficiently completed and an effective method or system is not reported.

SUMMARY OF THE INVENTION

This invention has been made in view of the above problems and an object of this invention is to provide a gate array device which may permit the operation voltage of a chip to be lowered without degrading the performance of the chip.

The above object can be attained by a gate array integrated circuit device comprising a first peripheral circuit formed in a semiconductor chip and having at least one circuit operated by a potential difference between first and second potentials; a voltage lowering circuit for lowering the first potential to a third potential; a gate array circuit group operated by a potential difference between the third and second potentials; and a second peripheral circuit operated by a potential difference between the third and second potentials.

In this invention, since the first potential is lowered to the third potential by means of the voltage lowering circuit provided in the semiconductor chip to derive the lowered potential in the chip, a problem that the performance of the chip will be degraded can be solved.

With the above semiconductor integrated circuit device, an external power source potential supplied the chip can be set to the same potential level as that (for example, 5V) of another semiconductor integrated circuit device. Further, since the gate array circuit group is operated on a lowered voltage (for example, 3.3V) in the chip, elements in the gate array circuit group can be further miniaturized.

In addition, the first peripheral circuit having a circuit operated by a potential difference between the first and second potentials is formed in the chip. A signal can be transferred with respect to another semiconductor integrated circuit device without converting the signal level by outputting a signal to the exterior of the chip by use of the first peripheral circuit. As a result, the semiconductor integrated circuit device according to this invention can be formed together with another semiconductor integrated circuit device in a systematic configuration on a single circuit board even if an interface for converting the signal level is not provided.

The inventors of this invention also developed novel input circuit, output circuit and voltage lowering circuit when they developed the above semiconductor integrated circuit device.

The input circuit among the circuits according to this invention comprises a first power source for supplying a first potential; a second power source for supplying a second potential lower than the first potential; a third power source for supplying a third potential having a potential level between the first and second potentials; an input terminal supplied with an input signal having a first amplitude lying in a range of a potential difference between the first and second potentials; a converter having a current path connected at one end to the input terminal, for converting the input signal to an internal signal having a second amplitude smaller than the first amplitude; a buffer having an output section and an input section connected to the other end of the current path of of the converter, for converting the internal signal to an output signal having substantially the same amplitude as the second amplitude; a compensation circuit having an input section and a current path connected at one end of a connection node between the converter and the buffer and connected at the other end to the third power source for compensating the amplitude of the internal signal; and an output terminal connected to the output section of the buffer.

In this invention, a problem that the amplitude of the internal signal converted by the converter fluctuates can be solved by connecting the compensation cult to the connection node between the converter and the buffer to compensate for fluctuation in the amplitude of the internal signal. Therefore, the buffer operation can be stabilized.

The output circuit according to this invention comprises a first power source for supplying a first potential; a second power source for supplying a second potential lower than the first potential; a third power source for supplying a third potential having a potential level between the first and second potentials; an input terminal supplied with an input signal having a first amplitude lying in a range of a potential difference between the first and second potentials; a buffer having an output section and an input section connected to the input terminal, for converting the input signal to an internal signal of a second amplitude which is substantially the same as the first amplitude; a pull-up circuit having an input section and a current path connected at one end to the first power source connected at the other end to an output terminal, for pulling up the potential of the output terminal; a pull-down circuit having an input section and a current path connected at one end to the second power source and connected at the other end to the output terminal, for pulling down the potential of the output terminal; a wiring for electrically connecting the output section of the buffer and the input section of the pull-down circuit to each other; and a level shifting circuit having an input section connected to the output section of the buffer, an output section connected to the input section of the pull-up circuit and a current path connected at one end to the first power source and connected at the other end to the first power source, for shifting the peak potential value of the internal signal to a potential peak value between the first and third potentials.

In this invention, a problem that an element constituting the pull-up circuit is electrostatically broken can be solved by connecting the level shifting circuit between the output section of the buffer and the pull-up circuit to shift the potential peak value of the internal signal output from the buffer to a potential peak value between the first and third potentials. Thus, an output signal having an amplitude larger than the amplitude of the internal signal can be output from the output circuit.

The voltage lowering circuit according to this invention comprises a power source; a diode having an anode connected to the power source; a first bipolar transistor having a collector connected to the power source and a base connected to the cathode of the diode; a second bipolar transistor having a collector connected to the emitter of the first bipolar transistor and a base connected to the base of the first bipolar transistor; and a lowered voltage supplying terminal connected to the emitter of the second bipolar transistor and supplied with a lowered potential which is lowered by the first and second bipolar transistors.

In this invention, even when a potential of the lowered potential supplying terminal is dropped by the presence of a load, the dropped potential can be rapidly returned to the original lowered potential by deriving the lowered potential by use of the two bipolar transistors having the collector-emitter paths serially connected and emitters connected together.

Thus, fluctuation in the lowered potential caused by the presence of the load can be suppressed and the lowered potential can be stabilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention. and together with the general description given above and the detailed description of the preferred embodiments given below, serve to explain the principles of the invention.

FIG. 1 is a construction diagram of a gate array chip according to a first embodiment of this invention;

FIG. 2 is a block diagram of the gate array chip of FIG. 1;

FIGS. 3A and 3B are construction diagrams of a system formed on a circuit board;

FIG. 5 is a circuit diagram of another example of the voltage lowering circuit according to this invention;

FIG. 6 is a circuit diagram of an input circuit according to this invention;

FIG. 7 is a circuit diagram of a first example of an output circuit according to this invention;

FIG. 9 is a circuit diagram showing a first example of supply of a potential to a basic cell;

FIG. 10 is a circuit diagram showing a second example of supply of a potential to a basic cell;

FIG. 11 is a circuit diagram showing a third example of supply of a potential to a basic cell;

FIG. 13 is a construction diagram of a system using a gate array chip according to a second embodiment of this invention;

FIG. 14 is a block diagram of the gate array chip according to the second embodiment of this invention and FIG. 15 is a circuit diagram showing a third example of an output circuit according to this invention.

DETAILED DESCRIPTION OF THE PREFERRED EMBODIMENTS

Figure 4A:
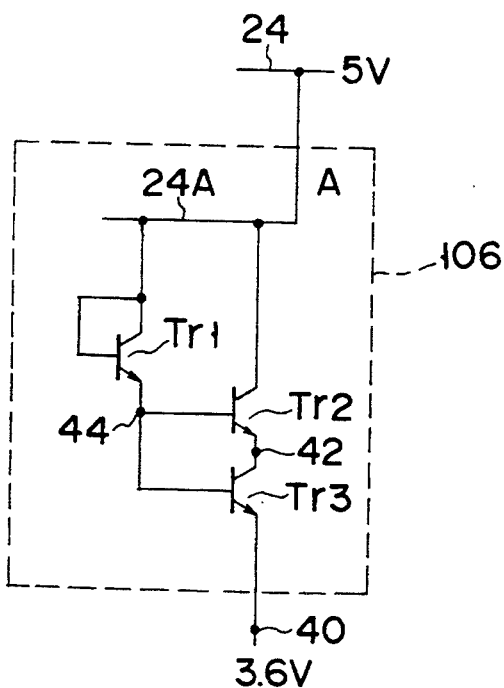
FIGS. 4A and 4B are circuit diagrams of a voltage lowering circuit according to this invention.

There will now be described an embodiment of this invention with reference to the accompanying drawings. In this description, the same reference numerals are attached to the same portions shown in the accompanying drawings and the repetitive explanation therefor is omitted.

FIG. 1 is a construction diagram of a gate array chip according to the first embodiment of this invention.

As shown in FIG. 1, a chip 10 includes a basic cell area 12 having basic cells B arranged in an array configuration and an input/output (I/O) circuit area 14 having I/O circuits C disposed around the area 12. The basic cell area 12 is divided into a plurality oil columns 16. A logic circuit is formed by selectively connecting elements in the columns 16. Voltage lowering cells A for lowering the potential are provided in each column 16. The potential lowered by the voltage lowering cell A is supplied to each of the columns 16 in the basic cell area 12.

FIG. 2 is a block diagram of the gate array chip shown in FIG. 1.

As shown in FIG. 2, a power source input circuit 100 is provided as a potential receiving port for receiving the power source potential from the exterior of the chip in the I/O circuit area 10. The power source input circuit 100 is supplied with an external power source potential (for example, 5V). The external power source potential is supplied to the I/O circuit area 14 via a power source line 20. Further, a voltage lowering circuit is provided in the power source input circuit 100. A lowered potential (for example, 3.3V) lowered by the voltage lowering circuit is supplied to the I/O circuit area 14 via a power source line 22. A power source line supplied with a ground potential is omitted for simplifying the drawing.

A signal input circuit 102 provided in the I/O circuit area 14 is supplied with an input signal having an amplitude of 5V, for example, from the exterior of the chip. A protection circuit is provided in the input circuit 102 to protect the circuit from an input signal having the amplitude of 5V. The protection circuit utilizes a protection diode having a cathode connected to an external power source of 5V. The input circuit will be described in detail later.

An output having an amplitude of approx. 5V is output from a signal output circuit 104 to the exterior. The output circuit 104 is supplied with an external power source potential 5V and a lowered potential 3.3V. The lowered potential 3.3V is used to operate a circuit for processing a chip internal signal (having an amplitude of approx. 3.3V) derived from the basic cell area 12. The external power source potential 5V is used to operate a circuit for processing an output signal output to the exterior of the chip. Like the input circuit, these circuits are also explained in detail later.

A power source line 24 arranged around the basic cell area 12 is lead out from the power source input circuit 100. The power source line 24 is connected to cell voltage lowering circuits 106 provided in the respective columns 16 of the basic cell area 12. The external power source potential 5V which is supplied to the chip is supplied to the power source line 24 as it is. The external power source potential 5V supplied to the power source line 24 is lowered to a cell internal lowered potential 3.3V by the cell voltage lowering circuit 106. The lowered potential 3.3V is supplied to cell internal power source lines 26 provided in the respective columns 16. Logic circuits 108 formed in the basic cell area 12 are operated on the lowered potential 3.3V. In FIG. 2, a power source line connected to the low potential terminal, for example, GND (ground) potential terminal is omitted for simplifying the drawing, but the GND line may be disposed in parallel with the power source lines 20 and 22 in the I/O circuit area 14 and in parallel with the cell internal power source lines 26 for the respective columns 16 in the basic cell area 12, for example.

The gate array of the above construction can be operated on a single external power source potential 5V. However, in the chip, the input circuit 102 is driven by the lowered voltage of 3.3V, but the protection circuit provided in the input circuit 102 is supplied with the external power source potential of 5V. The output circuit 104 is operated on the external power source voltage of 5V and the lowered potential of 3.3V. Further, the logic circuit 108 provided in the basic cell area 12 is operated on the lowered potential of 3.3V.

Therefore, the voltage applied to the cell in the basic cell area 12 can be lowered, active elements constituting the cell can be miniaturized and the integration density of the gate arrays, that is, the number of gates to be integrated can be increased. Further, since the operation voltage of the basic area 12 occupying most part of the chip is lowered, the power consumption in the chip can be reduced.

Degradation in the system performance of the chip with reduction in the operation voltage can be suppressed by supplying the external power source voltage of 5V as it is to the I/O circuit area 14 and operating the output circuit 104, for example, by the external power source potential of 5V. That is, since part of the output circuit 104 is switched by the external power source potential of 5V, the switching speed thereof becomes higher than the operation speed of the chip which is operated on the operation voltage of 3.3V and is not inferior to the operation speed of the 5V chip. Thus, even in a chip which is operated by a low voltage, reduction in the operation speed can be compensated and degradation in the system performance of the chip can be suppressed even when the operation voltage is lowered. Further, since the output circuit 104 operated on 5V, an output signal of approx. 5V can be derived.

In addition, since the protection circuit provided in the input circuit 102 is connected to the external power source potential of 5V, an input signal of approx. 5V can be input.

The gate array device according to this invention and another 5V semiconductor device can be connected to each other without converting the signal level and can be formed on the circuit board in a systematic configuration. The power source can also be used for another 5V semiconductor device.

FIGS. 3A and 3B are construction diagrams of a system formed on a circuit board. FIG. 3A shows a system having a 3.3V chip and a 5V chip. FIG. 3B shows a system having a gate array according to this invention and a 5V chip.

In the system shown in FIG. 3A, a power source line VDD5V for operating a semiconductor device 32 having a 5V chip mounted thereon and a power source line VDD3.3V for operating a semiconductor device 34 having a 3.3V chip mounted thereon are formed on a circuit board 30. Further, it is necessary to convert the levels of information signals transferred between the devices 32 and 34 via an interface 36.

In the system using a gate array 38 according to this invention shown in FIG. 3B, a power source line formed on the circuit board 30 includes only the power source line VDD5V. Further, when the 5V semiconductor device 32 and the gate array 38 are connected to each other, an interface for converting the levels of information signals is not necessary.

Thus, according to the gate array of this invention, the system design can be simplified and the area of the circuit board 30 on which the system is formed can be reduced.

Next, the internal construction of the gate array according to this invention is explained in detail with reference to FIGS. 4 to 12.

Figure 4B:
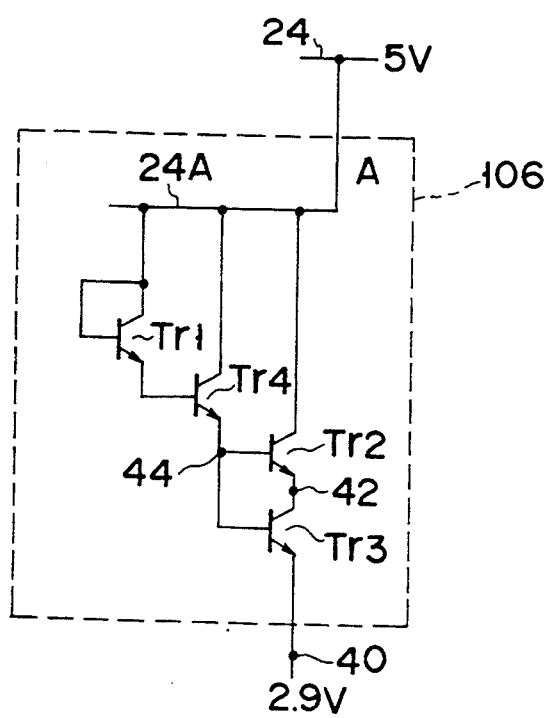

FIGS. 4A and 4B are concrete circuit diagrams the voltage lowering circuit 106. FIG. 4A is a circuit diagram of a basic voltage lowering circuit. FIG. 4B is a circuit diagram of a voltage lowering circuit which gives a lowered potential different from that obtained by the voltage lowering circuit of FIG. 4A.

As shown in FIG. 4A, the external power source potential, for example, 5V is transmitted to a voltage lowering cell A via a power source line 24A. The power source line 24A is connected to the collectors of npn transistors Tr1 and Tr2. The collector and base of the npn transistor Tr1 are connected together and the transistor acts as a diode. The emitter (cathode) of the transistor Tr1 serving as a diode is connected to the base of the transistor Tr2 and the base of an npn transistor Tr3 which is series-connected with the transistor Tr2.

With the above voltage lowering circuit, since the bases of the transistors Tr2 and Tr3 are connected together, the potential of a base connection node 42 and the potential of an output node 40 are set substantially equal to each other in the steady state. The potential is lower than the potential of a base connection node by a forward voltage drop $V_F$ (approx. 0.7V) of the pn junction. The potential of the node 44 is lower than the potential 5V of the power source line 24A by approx. 0.7V. Thus, the above voltage lowering circuit can be operated to lower a voltage of 5V to 3.6V.

In the above voltage lowering circuit, the transistor connected to the output node 40 is series connected to the transistor between the output node 40 and the power source line 24A with the bases thereof connected together and the following effects can be obtained.

For example, assume that, in the transition state, a large current flows into a load (not shown) which will be connected to the output node 40, thereby causing the potential of the output node 40 to become lower than 3.6V. At this time, a current flows from the node 44 into the base of the transistor Tr3 and a collector current flows from the node 42 to the output node 40.

However, in the voltage lowering circuit shown in FIG. 4A, since the base current also flows into the transistor Tr2 according to the fall of the potential of the node 42, the collector current of the transistor Tr2 flows to compensate for the collector current of the transistor Tr3. By this circuit operation, the potential of the output node 40 can be rapidly pulled up to 3.6V which is set in the steady state even if the potential of the output node 40 is lowered.

Further, when the base current of the transistor Tr3 does not completely disappear, a current will flow between the collector and the emitter of the transistor Tr3 even if the potential of the output node 40 is returned to 3.6V.

However, in the voltage lowering circuit of FIG. 4A, the bases of the transistors Tr2 and Tr3 are connected together, the potential of the output node 40 and the potential of the node 42 are equal to each other. That is, the potentials of the nodes 40 and 42 are both set at 3.6V, and when the potential of the output node 40 is returned to 3.6V, no potential difference occurs between the collector and the emitter of the transistor Tr3, thereby preventing the collector current from flowing in the transistor Tr3.

Further, there is a possibility that when the potential of the output node 40 is recovered, an excessive amount of collector current may flow into the transistor Tr2 and the potential of the node 42 will become slightly higher than the potential of the output node 40.

However, in the voltage lowering circuit of FIG. 4A, since it is necessary to apply approx. 0.2V or more between the collector and the emitter in order to permit a collector current to flow in the bipolar transistor, it is seldom that the collector current may flow in the transistor Tr3 of the above circuit.

Next, a method of adjusting the potential to be lowered by the voltage lowering circuit of FIG. 4A is explained below.

As shown in FIG. 4B, in order to adjust the potential to be lowered, a transistor Tr4 having a collector connected to the power source line 24A may be connected between the emitter of the transistor Tr1 and the common bases of the transistors Tr2 and Tr3 in the Darlington connection configuration.

The potential to be lowered can be adjusted with the effects obtained by the voltage lowering circuit of FIG. 4A by connecting the transistor Tr4 in the Darlington connection configuration. With the voltage lowering circuit of FIG. 4B, a lowered voltage of approx. 2.9V can be derived. Further, if the number of stages of the Darlington connection is increased, the lowered voltage can be sequentially set to a voltage lower than 2.9V, for example, 2.2V, 1.5, . . . .

FIG. 5 is a circuit diagram of another example of the voltage lowering circuit.

The voltage lowering circuit shown in FIG. 4A or 4B starts to operate at the same time that the external power source of 5V is turned on by means of the transistor Tr2 connected in a diode configuration. In the modification of FIG. 5, the operation of the voltage lowering circuit is controlled by a p-channel MOSFET Q1, for example.

As shown in FIG. 5, a control signal S1 is supplied to the gate of the MOSFET Q1 to turn on or off the MOSFET Q1. The source of the MOSFET Q1 is connected to the power source line 24A and the drain thereof is connected to the base of a bipolar transistor Tr5. The collector of the transistor Tr5 is connected to the power source line 24A and the emitter thereof is connected to a base connection node of transistors Tr6 and Tr7 which are series-connected between the output node 40 and the power source line 24A.

With the above voltage lowering circuit, the MOSFET Q1 is turned on or off according to the signal level of the control signal S1 so as to control supply of the base current to the transistor Tr5. Thus, the voltage lowering circuit can effect the switching operation irrespective of the turn-on or off of the external power source.

With the voltage lowering circuit of FIG. 5., when assuming that no loss occurs in the MOSFET Q1, the lowered voltage is set to a value obtained by subtracting the voltage drop (approx. 0.7V) in the pn junction of the transistor Tr5 and the voltage drop (approx. 0.7V) in the pn junction of the transistor Tr7 from the external power source potential of 5V. Thus, the lowered voltage becomes 3.6V.

As described above, in the circuits shown in FIGS. 4A, 4B and 5, the number of elements is small and the area of the circuit can be made small. In addition, the response to variation in the current flowing in the load is excellent and a stable lowered potential can always be supplied to the power source line.

Further, the voltage lowering circuits shown FIGS. 4A, 4B and 5 can be used not only as a voltage lowering circuit for the gate array shown in FIG. 2 but also as a voltage lowering circuit for another semiconductor device.

FIG. 6 is a concrete circuit diagram of the input circuit 102.

As shown in FIG. 6, an input signal In1 from the exterior of the chip is supplied to an input pad electrode 50. The input signal IN1 has an amplitude of 5V, for example. The input pad electrode 50 is connected to one end of a resistor R1. A diode D1 is connected between a wiring connecting the input pad electrode 50 to the resistor R1 and an external power source potential 5V and a diode D2 is connected between the wiring and the ground terminal. The diodes D1 and D2 are protection diodes. The other end of the resistor R1 is connected to one end of a voltage lowering section 52 for lowering the potential of the input signal IN1. The voltage lowering section 52 is an n-channel MOSFET Q2 having a drain coupled with the input pad electrode 50 and a gate coupled to the lowered potential of 3.3V. The input signal IN1 with an amplitude of 5V is converted/lowered to 2.6V by the back-gate bias effect of the MOSFET Q2 and the voltage applied to the gate thereof. The other end of the voltage lowering section 52 is connected to one end of a buffer section 54 to which the converted/lowered signal IN1T is supplied. The buffer section 54 is formed of a CMOS inverter constructed by a p-channel MOSFET Q3 and an n-channel MOSFET Q4, for example. The inverter is driven by the lowered voltage of 3.3V. The other end of the buffer section 54 is connected to an output terminal 56 of the input circuit 102 and a signal IN1A having an inverted form of the input signal IN1 and having an amplitude of 3.3V, for example, is output from the output terminal 56. The signal IN1A is supplied to a logic circuit in a basic cell area (not shown). The input terminal of a compensation section 58 for compensating the level of the converted/lowered signal IN1T is connected to a node 60 between the output terminal 56 and the buffer section 54. One end of the compensation section 58 is connected to a connection node 62 between the buffer section 54 and the voltage lowering section 52 and the other end thereof is coupled to the lowered potential 3.3V.

In the input circuit shown in FIG. 6, the following effects can be obtained by providing the compensation section 58 for compensating the level of the converted/lowered signal IN1T.

First, a case where no compensation circuit is used is explained. In this case, the voltage level of the signal IN1T derived from the voltage lowering section 52 is approx. 2.6V. With this voltage level, the gate source voltage $V_{GS}$ becomes −0.7V and is set to an off-gate voltage with substantially no margin with respect to the threshold voltage of −0.8V of the p-channel MOSFET Q3. As a result, the MOSFET Q3 of the inverter cannot be always completely turned off when taking variation in the performance of the active element into consideration. For example, assume that the MOSFET Q2 is formed to have $V_{GS}$ equal to or larger than −0.8 by fluctuation in the manufacturing process. In this case, the MOSFET Q3 is not turned off when the signal IN1A is set to the "L" level, and a leak current will flow. Since the leak current will act to prevent the transition of the signal IN1A from the "H" level to the "L" level, the operation speed of the input circuit is lowered. Further, since the leak current flows as a stand-by current, the power consumption is increased.

In contrast, in the input circuit shown in FIG. 6, since the compensation section 58 for compensating the level of the converted/lowered signal IN1T is provided, the voltage level of the signal IN1T can be set so as to completely turn on or off both of the MOSFETs Q3 and Q4. More specifically, the compensation section 58 is a p-channel MOSFET Q5 having a gate connected to a node 60, a drain connected to a node 62 and a source coupled to the lowered potential 3.3V.

According to the compensation section 58 with the above construction, when the signal IN1A is set to the "L" level, the p-channel MOSFET Q5 is turned on to detect change of the signal level and permit a current to flow in the node 62 so as to set the voltage level of the signal IN1T to a voltage level-by which the MOSFET Q3 can be completely turned off. Thus, the buffer section 54 can always be stably operated and a leak current flowing via the MOSFET Q3 is prevented.

Further, since no current flows, no stand-by current flows, thereby reducing the power consumption and preventing the operation speed of the input circuit from being lowered.

When the signal IN1A is set at the "H" level, the MOSFET Q5 constituting the compensation section 58 is turned off, giving no influence on the operation of the circuit.

FIG. 7 is a concrete circuit diagram of the output circuit 104.

As shown in FIG. 7, a signal OUT1A from the logic circuit in the basic cell area (not shown) is input to an input terminal 70. The signal OUT1A has an amplitude of approx. 3.3V, for example. The input terminal 70 is connected to a buffer section 72. The buffer section 72 is formed of a CMOS inverter constructed by a p-channel MOSFET Q10 and an n-channel MOSFET Q11, for example. An output node 74 of the buffer section is connected to a pull-up section 78 via a level shifting section 76 and connected to a pull-down section 80. The level shifting section 76 includes a resistor R2 coupled at one end to an external power source potential 5V and an npn transistor Tr10 having an emitter grounded and a collector connected to the other end of the resistor R2. The output node 74 of the buffer section 72 is connected to the base of the transistor Tr10. An output of the level shifting section 76 is derived from a common connection node between the resistor R2 and the transistor Tr10. A node 77 is connected to the base of an npn transistor Tr11 constituting the pull-up section 78. The pull-down section 80 is constituted by an npn transistor Tr12. An output buffer 79 is constituted by the pull-up section 78 and the pull-down section 80. The base of the transistor Tr12 is connected to the output node 74 of the output buffer section 72. The transistors Tr11 and Tr12 are series-connected between the external power source of 5V and the ground terminal. A connection node 81 between the transistors is connected to an output pad electrode 82.

Next, the operation of the output circuit shown in FIG. 7 is explained.

First, when the signal OUT1A is set at the "H" level, an "L" level signal is output from the output node 74 of the buffer section 72 and the transistors Tr10 and Tr12 are both turned off by the output signal. When the transistor Tr10 is turned off, a current flows into the base of the transistor Tr11 via the resistor R2 to turn on the transistor Tr11. As a result, an output signal OUT1 of "H" level is output from the output circuit 104. The output signal OUT1 is set to a level obtained by subtracting the pn forward voltage drop $V_F$ from the external power source potential of 5V, for example, a level of approx. 4.3V.

When the signal OUT1A is set at the "L" level, a signal of "H" level is output from the node 74 of the buffer section 72 to turn on both of the transistors Tr10 and Tr12. When the transistor Tr10 is turned on, supply of a current to the base of the transistor Tr11 is interrupted to turn off the transistor Tr11. As a result, an output signal OUT1 of "L" level (approx. 0.7V) is output from the output circuit 104.

With the output circuit of FIG. 7, the internal signal OUT1A having an amplitude of approx. 3.3V can be converted to the output signal OUT1 having a maximum voltage of approx. 4.3V and supplied to the exterior of the chip. At the time of the above conversion, a voltage of more than 3.3V will not be applied between the gate and the substrate of the MOSFETs Q10 and Q11, and the MOSFETs Q10 and Q11 can be formed with the fine structure having a thin gate insulation film, for example.

Figure 8:
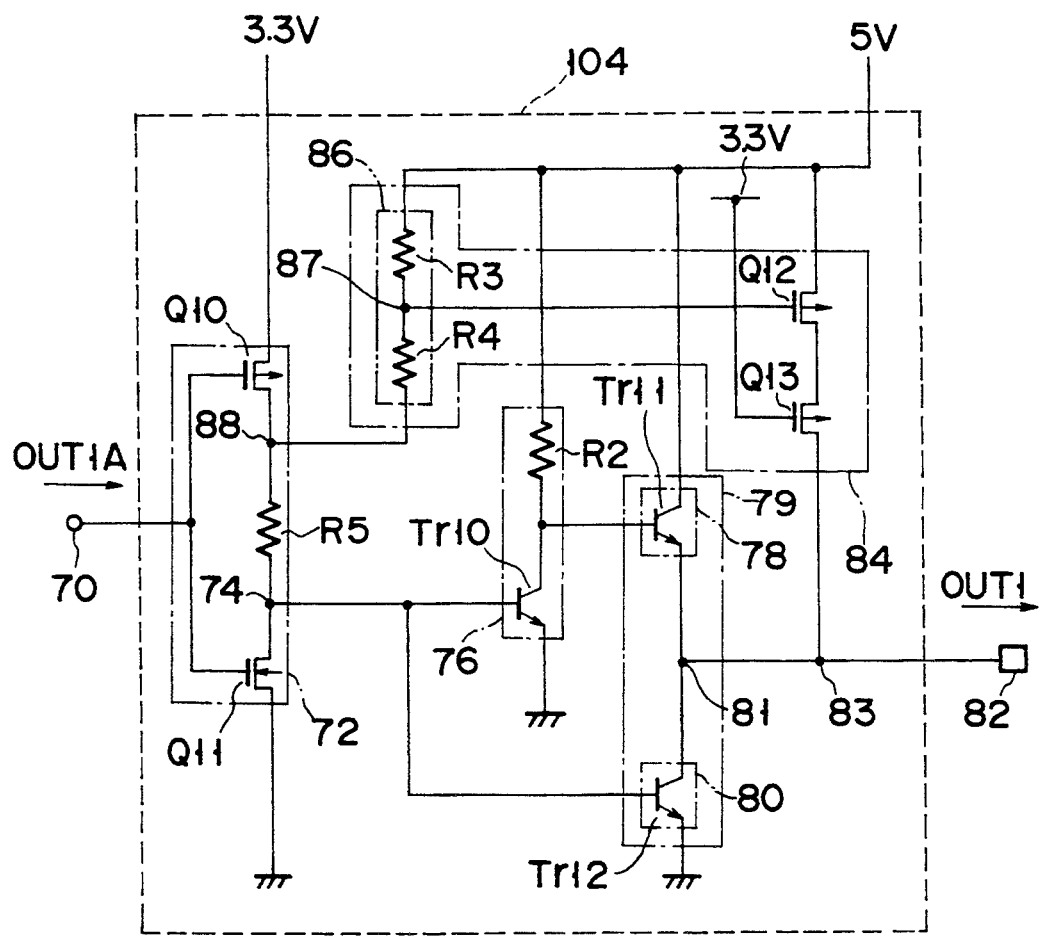
FIG. 8 is a circuit diagram of a second example of the output circuit according to this invention.

FIG. 8 is a circuit diagram of another example of the output circuit 104.

In the output circuit shown in FIG. 8, an "H" level voltage compensation section 84 for compensating the "H" level voltage of the output signal OUT1 is connected to a connection node 83 between a node 81 and an output pad electrode 82.

The compensation section 84 includes a voltage dividing section 86, a p-channel MOSFET Q12 having a gate connected to a voltage driving point 87 of the voltage dividing section and a source connected to an external power source of 5V, and a p-channel MOSFET Q13 series-connected to the MOSFET Q12, and having a drain connected to the node 83 and a gate always supplied with a lowered voltage of 3.3V.

The voltage dividing section 86 is constituted by a series circuit of a resistor R3 and a resistor R4, and the resistor R3 is connected to the external power source of 5V and the resistor R4 is connected to a connection node 88 between a resistor R5 of the buffer section 72 and the MOSFET Q10.

Next, the operation of the output circuit shown in FIG. 8 is explained.

First, when the signal OUT1A is at the "H" level, the MOSFET Q11 is turned on so that a current may flow in a path from the power source voltage of 5V to the MOSFET Q11 via the voltage dividing section 86, node 88 and resistor R5. As a result, a signal of "L" level is derived from the output node 74 and the transistors Tr10, Tr12 are both turned off. When the transistor Tr10 is turned off, the transistor Tr11 is turned on so that the potential of the node 81 will be set to the "H" level. The potential of the voltage dividing point 87 is lower than the external power source potential of 5V by a voltage drop across the resistor R3. Therefore, the gate-source voltage VGS of the MOSFET Q12 whose gate is connected to the voltage dividing point 87 and whose source is connected to the external power source of 5V becomes negative and the MOSFET Q12 is turned on. Also, the gate-source voltage VGS of the MOSFET Q13 whose source is connected to the drain of the MOSFET Q12 becomes negative so that the MOSFET Q13 is turned on to permit a current to flow to the node 83. Therefore, a current flows from the external power source of 5V to the output pad electrode 82 via a parallel section having a path including the transistor Tr11 and a path including the MOSFETs Q12 and Q13. As a result, a voltage drop of approx. 0.7V in the path including the transistor Tr11 can be compensated for by the path including the MOSFETs Q12 and Q13 and connected in parallel with the former path and an "H" level signal having a voltage level of approx. 5V can be derived as the output signal OUT1.

When the signal OUT1A is at the "L" level, the MOSFET Q11 is turned off so that the potential of the output node 74 will be set to the "H" level to turn on both of the transistors Tr10 and Tr12. As a result, the potential of the node 81 is set to the "L" level. Also, at this time, both of the MOSFETs Q12 and Q13 are set in the ON state, but since a current flows from the node 83 to the ground terminal via the node 81 and transistor Tr12, an output signal OUT1 output to the output pad electrode 82 is set to the "L" level.

With the output circuit of FIG. 8, since the "H" level compensation section 84 is connected to the connection node between the node 81 and the output pad electrode 82, the internal signal OUT1A having an amplitude of approx. 3.3V in the chip can be converted to an output signal OUT1 having a maximum voltage of approx. 5V. Also, in this circuit, a voltage higher than 3.3V will be prevented from being applied between the gate and the substrate of the MOSFETs Q10 and Q11. Further, in the MOSFETs Q12 and Q13 of the compensation section 84, since a voltage (for example, 3.3V) power than 5V is always applied to the gates thereof, a voltage which is as high as 5V will be prevented from being applied between the gate and the substrate thereof. Therefore, the MOSFETs Q12 and Q13 constituting the compensation section 84 can be miniaturized like the MOSFETs Q10 and Q11.

Next, a method of supplying a lowered potential to the basic cell area 12 is explained.

FIGS. 9 to 11 are circuit diagrams showing the method of supplying the lowered potential to the basic cell area 12.

FIG. 9 is a circuit diagram of a first example of the circuit.

As shown in FIG. 9, the first voltage supplying method is to dispose voltage lowering cells A on both sides of each column 16 and supply the lowered voltages from the opposite ends of each column 16 of basic cells B. A power source line 24 is formed to extend around the basic cell area 12. The power source line 24 (which is applied with an external power source potential of 5V) is connected to voltage lowering circuits 106. The potential of the power source line 24 is lowered to a preset potential level (for example, 3.3V) by means of the voltage lowering circuit 106. The lowered potential is supplied to inter-cell power source lines 26 which are disposed for the respective columns 16. Two ends of each inter-cell power source line 26 are connected to output nodes 40 of corresponding two of the voltage lowering circuits 106. A logic circuit 108 which is constructed by the basic cells B is operated by a potential difference between the inter-cell power source line 26 and the inter-cell ground line 26GND which is disposed in parallel with the power source line 26.

With the circuit of FIG. 9, the voltage lowering circuits 106 are connected to the opposite ends of the inter-cell power source line 26 and the lowered potentials are supplied from both ends of the power source line 26. Therefore, a potential drop in the end portion of the power source line 26 can be prevented and the rise time of the potential of the power source line 26 can be shortened.

The voltage lowering circuit 106 supplies a potential of 3.6V to the output node 40, but the potential of 3.6V is obtained on the assumption that the resistance of the load connected between the voltage lowering circuit 106 and the ground is sufficiently large. In practice, however, the resistance is made small because a current flows in the load (or the logic circuit). As the resistance becomes smaller, a larger current flows in the transistors Tr1, Tr2 and Tr3 so that the forward voltage drops $V_F$ of the transistors may be shifted to a value larger than 0.7V. As a result, the potential of the output node 40 of the voltage lowering circuit is set to 3.6V. In addition, since the forward voltage drop $V_F$ may be shifted to a larger value by various factors such as the temperature of the chip, the potential of the output node 40, that is, the potential of the cell power source line 26 will be stabilized at approx. 3.3V in the actual integrated circuit.

FIG. 10 is a circuit diagram of a second example of the circuit.

In the circuit of FIG. 10, the low potential side is not set at the ground potential but set at a potential higher than the ground potential and a logic circuit 108 is operated by a potential difference between the low-side potential and a lowered potential obtained by lowering the external power source potential.

As shown in FIG. 10, voltage lowering cells A for supplying lowered potentials to the basic cell area 32 are disposed on one-side portions of the respective columns 16 and voltage raising cells D for raising the ground potential to create a potential used as a low side potential of the basic cell area 12 are disposed on the other side portions of the respective columns 16. A voltage lowering circuit 106A in the voltage lowering cell A includes an npn transistor Tr21 having a collector connected to the power source line 24 and an npn transistor Tr22 having a collector connected to the emitter of the transistor Tr21. The bases of the transistors Tr21 and Tr22 are commonly connected to the collector of the transistor Tr21. The lowered potential is supplied to a corresponding one of inter-cell power source lines 26H which is connected to the emitter of a corresponding one of the transistors Tr22.

With the voltage lowering circuit 106A shown in FIG. 10, a potential of less than approx. 4.3V which is lower than the potential of 5V of the power source line 24 by the forward voltage drop $V_F$ can be supplied to the inter-cell power source line 26H. A voltage raising circuit 206 in the voltage raising cell D includes an npn transistor Tr23 having an emitter connected to the ground line GND and an npn transistor Tr24 having an emitter connected to the collector of the transistor Tr23. The bases of the transistors Tr23 and Tr24 are commonly connected to the collector of the transistor Tr24. The raised potential is supplied to an inter-cell low potential power source line 26L connected to the collector of the transistor Tr24. With the raising circuit 206 of the above construction, a potential of more than approx. 0.7V which is higher than the ground potential by the forward voltage drop $V_F$ can be supplied to the low potential power source line 26L.

With the circuit of FIG. 10, the logic circuit 108 surrounded by the basic cells B is operated by a potential difference V expressed by the following equation.

V=(potential of the inter-cell power source line 26H)—(potential of the inter-cell low potential power source line 26L)

The logic circuit 108 can also be operated by use of the above method. Of course, it is possible to set a voltage applied to the cells of the basic cell area 12 lower than the potential 5V (external power source potential) of the power source line 24 by use of the above method.

FIG. 11 is a circuit diagram of a third example of the circuit.

In the circuit shown in FIG. 11, the lowered potentials are set to adequate potential levels for respective columns 16 and the lowered potential of different potential levels is supplied in a basic cell area 12.

As shown in FIG. 11, voltage lowering cells A are disposed on both sides of respective columns 16A, 16B and 16C. The voltage lowering cells A of the columns 16A and 16B are each constructed by the voltage lowering circuit 106 shown in FIG. 4A and the voltage lowering cell A of the column 16C is constructed by the voltage lowering circuit 106B shown in FIG. 4B. The lowered potential obtained by the voltage lowering circuit 106B is lower than the lowered potential obtained by the voltage lowering circuit 106. Therefore, lowered voltages of approx. 3.3V obtained as explained by use of the circuit shown in FIG. 9 are supplied to the inter-cell power source lines 26A provided in the columns 16A and 16B, and a lowered potential of approx. 2.6V is supplied to the inter-cell power source line 26B provided in the column 16C.

With the circuit of FIG. 11, lowered potentials can be set for the respective columns 16 in the basic cell area 12. As described above, it is possible to set optimum lowered potentials for the respective columns 16.

Figure 12:
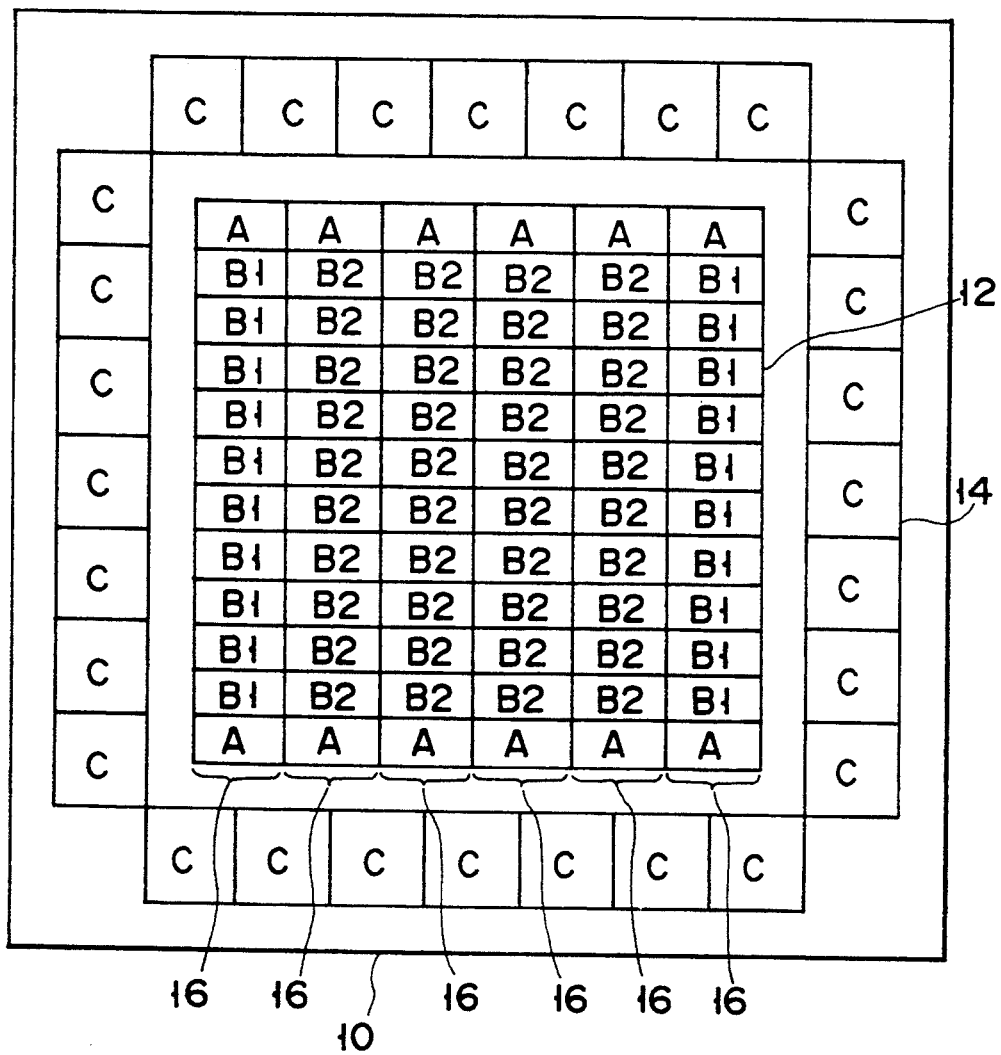
FIG. 12 is a construction diagram of a gate array chip using the circuit shown in FIG. 11.

FIG. 12 is a construction diagram of a gate array chip using the circuit shown in FIG. 11.

As shown in FIG. 12, columns in which cells B1 operated on a voltage of approx. 3.3V are disposed and columns in which cells B2 operated on a voltage of approx. 2.6V are disposed are arranged on the basic cell area 12.

FIG. 13 is a diagram showing a system using the gate array chip according to a second embodiment of this invention.

As shown in FIG. 13, a gate array device 202 according to the second embodiment and another semiconductor device 204 are disposed to constitute a system on a circuit board 200. Further, power source lines VDD3.3V and GND are disposed on the circuit board 200. The devices 202 and 204 are operated on the operation voltage of 3.3V. The gate array device 202 has a terminal for receiving a voltage of VDD5V in addition to a terminal for receiving the operation power source voltage.

FIG. 14 is a block diagram of a portion in the gate array chip according to the second embodiment.

As shown in FIG. 14, an input circuit 208 supplied with an input signal IN from the exterior of a chip 205 via an input pad electrode 206 is formed in the chip 205. The input signal IN has an amplitude of approx. 3.3V, for example. An input buffer 210 is disposed in the input circuit 208 and the external input signal IN is converted to an internal signal by the input buffer 210. The internal signal is supplied to a basic cell area 212 in which a logic circuit for processing the signal is formed. A logic circuit 214 for effecting a desired signal process is formed in the basic cell area 212. The logic circuit 214 effects the process such as arithmetic operations in response to the internal signal and supplies an internal signal obtained as the result of process to an output circuit 216.

An output buffer 218 for converting the chip internal signal to an external output signal is disposed in the output circuit 216.

The input circuit 210, the logic circuit 214 and output buffer 218 formed in the basic cell area 212 are operated on an operation voltage of 3.3V. A level shifting section 220 for shifting the level of an output signal from the output buffer 218 is disposed in the output circuit 216. The level shifting section 220 is operated by an operation voltage of 5V and the level the output signal of the output buffer 218 is shifted from 3.3V to approx. 5V, for example. The shifted voltage is lowered by a voltage lowering section 222 and the potential of the signal which has been shifted to approx. 5V is lowered to approx. 3.3V. The signal lowered by the voltage lowering section 222 is supplied to the exterior of the chip via an output pad electrode 224 as an output signal to the exterior of the chip.

With the gate array shown in FIG. 14, since the chip internal signal is switched by a high voltage of 5V which is higher than the operation voltage of 3.3V, the internal signal processing speed is enhanced. This is because a larger signal current flows as the operation voltage becomes higher and the rise time for operating the elements constituting the circuit can be shortened.

The operation characteristic of the circuit formed in the semiconductor device whose operation voltage is lowered becomes dull and the performance of the chip is degraded.

However, like the gate array shown in FIG. 14, the circuit operation speed can be enhanced and degradation in the performance can be prevented by operating at least part of the circuits by a higher voltage.

It is preferable that a circuit such as an output circuit which requires a high operation speed is selected as the circuit to be operated on a higher operation voltage.

It is necessary to form fine elements in the basic cell area in order to increase the number of integrated gates in the gate array device. Therefore, it is desired that a circuit formed in the I/O circuit area which may have some margin for integration should be operated on a higher operation voltage.

FIG. 15 is a concrete circuit diagram of the output circuit 216 of the gate array shown in FIG. 14.

As shown in FIG. 15, an input terminal 226 is supplied with a chip internal signal OUTa from a logic circuit in the basic area (not shown). The signal OUTa has an amplitude of approx. 3.3V, for example. The input terminal 226 is connected to first and second buffer sections 218A and 218B. The first buffer section 218A includes a CMOS inverter constructed by p-channel MOSFETs Q41 and Q41. The second buffer section 218B is shown by a symbol of inverter in FIG. 15, but it may include a CMOS inverter like the first buffer section, for example. The output of the first buffer section 218A is connected to a level shifting section 220. The level shifting section 220 has a resistor R40 connected to a high potential power source of 5V and an npn transistor Tr41 having a collector connected to the resistor R40 and a grounded emitter. The output of the first buffer section 218A is connected to the base of the transistor Tr41. The output of the second buffer section 218B is connected to the gate of an n-channel MOSFET Q42 constituting a pull-down section 228. An output of the level shifting section 220 is derived from a connection node 230 between the resistor R40 and the transistor Tr40 and the node 230 is connected to a voltage lowering section 222. The voltage lowering section 222 is constructed by the voltage lowering section shown in FIG. 4 and includes an npn transistor Tr41 having a collector connected to the high potential power source of 5V and npn transistors Tr42 and Tr43 having bases connected together and collector-emitter paths series-connected between the high potential side and the low potential side. The emitter of the transistor Tr41 is connected to the common base of the transistors Tr42 and Tr43 and to the collector of an npn transistor Tr44. The emitter of the transistor Tr44 is grounded and the base thereof is connected to the output of the first buffer section 218A. The transistor Tr44 is used to extract a base current supplied from the transistor Tr41 to the transistors Tr42 and Tr43. The emitter of the transistor Tr43 is connected to the drain of the transistor Tr42 and an output signal OUT from the output circuit 216 is derived from a connection node 232 between the emitter of the transistor Tr43 and the drain of the transistor Tr42. The node 232 is connected to an output pad electrode 224.

Next, the operation of the output circuit shown FIG. 15 is explained.

First, a case wherein the chip internal signal OUTa is set at the "H" level is explained. The first and second buffer sections 218A and 218B output an "L" level signal in response to an "H" level signal. The transistors Tr40, Tr44, and MOSFET Q42 are turned off by the "L" level signal. When the transistors Tr40 and Tr44 are turned off, a current is supplied from the high potential power source of 5V to the base of the transistor Tr41 via the resistor R40. As a result, the transistor TR41 is turned on. When the transistor Tr41 is turned on, a current flows into the common base the transistors Tr42 and Tr43 to turn on the same. Further, since the MOSFET Q42 is turned off, an "H" level signal derived from the high potential power source is output from the node 232 via the transistor Tr41 and the transistors Tr42 and Tr43 having a common base. The potential of the "H" level signal is approx. 3.6V.

When the chip internal signal OUTa is set at the "L" level, the internal signal OUTa of "L" level is supplied to the first and second buffer sections 218A and 218B which in turn output "H" level signals. As a result, the transistors Tr40 and Tr44 and MOSFET Q42 are all turned on. When the transistors Tr40 and Tr44 are turned on, a current flows from the high potential power source of 5V via the transistors Tr40 and Tr44. Therefore, the transistors Tr41, Tr42 and Tr43 are turned off. Further, since the MOSFET Q42 is turned on, an "L" level signal is output from the node 232.

With the output circuit 216 of FIG. 15, since conversion of the internal signal OUTa to the external output signal OUT is effected by use of the circuit which is switched by a high potential, for example, a potential of 5V, the processing speed of the output circuit is enhanced. As a result, the chip performance can be enhanced by incorporating the output circuit into the chip.

This invention has been explained with reference the two embodiments, but this invention is not limited to the above embodiments and can be variously modified without departing from the technical scope thereof. For example, the external power source potential is not limited to 5V and the lowered voltage is not limited to 3.3V.

Further, the voltage lowering circuits shown in FIGS. 4A, 4B and 5, the input circuit shown in FIG. 6 and the output circuits shown in FIGS. 7 and 8 can be incorporated not only into the gate array device but also into various semiconductor devices.

In addition, this invention can be variously modified.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A gate array integrated circuit device comprising:
a semiconductor chip;
a voltage lowering means for lowering a first potential to a second potential, said voltage lowering means provided in said chip;
a gate array circuit group provided in said chip and operated by a potential difference between said second potential and a third potential, which is lower than said second potential;
a first peripheral circuit provided in said chip;
a second peripheral circuit provided in said chip;
said first peripheral circuit including an external signal output circuit for converting a first array signal of a first amplitude to a first chip external signal having a second amplitude, said first array signal output from said gate array circuit group, said second amplitude larger than said first amplitude;
said second peripheral circuit including an external signal input circuit for converting a second chip external signal of substantially said second amplitude to a second array signal of substantially said first amplitude, said second chip external signal output from an exterior of said chip;
said external signal output circuit including a first buffer for converting said first array signal to a first internal signal of an amplitude lying in a range of a potential difference between said second and third potentials and outputting said first internal signal, said first buffer operated by a potential difference between said second and third potentials;
said external signal output circuit including a second buffer for converting said first internal signal to said first chip external signal and outputting said first chip external signal to the exterior of said chip, said second buffer operated by a potential difference between said first and third potentials;
said external signal input circuit including a converter for converting said second chip external signal to a second internal signal of an amplitude lying in a range of potential difference between said second and third potentials and outputting said second internal signal;
said external signal input circuit including a third buffer for converting said second internal signal to said second array signal and outputting said second array signal to said gate array circuit group, said third buffer operated by a potential difference between said second and third potentials;
wherein said third potential is one of binary signal logical levels, and said gate array circuit group, said peripheral circuit and said second peripheral circuit have said one signal logical level in common;
said first buffer includes a first switch having an input section supplied with said first array signal and a current path connected at one end to a first power source for supplying said second potential, the other end of the current path thereof being used as an output terminal for outputting said first internal signal, and a second switch having an input section supplied with said first array signal and a current path connected at one end to the other end of the current path of said first switch and connected at the other end to a second power source for supplying said third potential, said second switch being set in the OFF or ON state when said first switch is set in the ON or OFF state, respectively;
said second buffer includes pull-up means having an input section connected to a connection node between said first and second switches and a current path connected at one end to a third power source for supplying said first potential, the other end of the current path thereof being used as an output terminal for outputting said first external signal, and pull-down means having an input section connected to the connection node between said first and second switches and a current path connected at one end to said second power source and connected at the other end to the other end of the current path of said pull-up means, said pull-down means being set in the OFF or ON state when said pull-up means is set in the ON or OFF state, respectively;
said converter includes a third switch having a current path and an input section connected to said first power source, one end of the current path thereof being used as a signal receiving terminal at which said second chip external signal is supplied and the other end of the current path being used as an output terminal for outputting said second internal signal; and
said third buffer includes a fourth switch having an input section supplied with said second internal signal and a current path connected at one end to said first power source, the other end of the current path thereof being used as an output terminal for outputting said second array signal, and a fifth switch having an input section supplied with said second internal signal and a current path connected at one end to the other end of the current path of said fourth switch and connected at the other end to said second power source, said fifth switch being set in the OFF or ON state when said fourth switch is set in the ON or OFF state, respectively.

2. A gate array integrated circuit device according to claim 1, wherein said first to fifth switches are constructed by insulated gate FETs, and said pull-up means and said pull-down means are constructed by bipolar transistors.

3. A gate array integrated circuit device comprising:
a semiconductor chip;
a voltage lowering means for lowering a first potential to a second potential, said voltage lowering means provided in said chip;
a gate array circuit group provided in said chip and operated by a potential difference between said second potential and a third potential, which is lower than said second potential;
a first peripheral circuit provided in said chip;
a second peripheral circuit provided in said chip;
said first peripheral circuit including an external signal output circuit for converting a first array signal of a first amplitude to a first chip external signal having a second amplitude, said first array signal output from said gate array circuit group, said second amplitude larger than said first amplitude;

said second peripheral circuit including an external signal input circuit for converting a second chip external signal of substantially said second amplitude to a second array signal of substantially said first amplitude, said second chip external signal output from an exterior of said chip;

said external signal output circuit including a first buffer for converting said first array signal to a first internal signal of an amplitude lying in a range of a potential difference between said second and third potentials and outputting said first internal signal, said first buffer operated by a potential difference between said second and third potentials;

said external signal output circuit including a second buffer for converting said first internal signal to said first chip external signal and outputting said first chip external signal to the exterior of said chip, said second buffer operated by a potential difference between said first and third potentials;

said external signal input circuit including a converter for converting said second chip external signal to a second internal signal of an amplitude lying in a range of potential difference between said second and third potentials and outputting said second internal signal;

said external signal input circuit including a third buffer for converting said second internal signal to said second array signal and outputting said second array signal to said gate array circuit group, said third buffer operated by a potential difference between said second and third potentials;

wherein said third potential is one of binary signal logical levels, and said gate array circuit group, said peripheral circuit and said second peripheral circuit have said one signal logical level in common;

said first and second peripheral circuits are formed in an I/O circuit area and said gate array circuit group is formed in a basic cell area; and said voltage lowering means includes I/O circuit area voltage lowering means for supplying the third potential to said I/O circuit area and basic cell area voltage lowering means for supplying the third potential to said basic cell area.

4. A gate array integrated circuit device according to claim 3, wherein a plurality of columns in each of which a plurality of gates are disposed in a row are arranged in said basic cell area and said basic cell area voltage lowering means is provided in each of said columns.

5. A gate array integrated circuit device according to claim 3, further comprising:
at least one first column arranged in said basic cell area;
first basic cell area voltage lowering means disposed in said first column;
a first logic circuit disposed in said first column and driven by a potential difference between the third and second potentials;
at least one second column arranged in said basic cell area;
second basic cell area voltage lowering means disposed in said second column, said second column lowering the first potential to a fourth potential lower than the third potential; and a second logic circuit disposed in said second column and driven by a potential difference between the fourth and second potentials.

6. An input circuit comprising;
a first power source for supplying a first potential;
a second power source for supplying a second potential lower than the first potential;
a third power source for supplying a third potential having a potential level between the first and second potentials;
an input terminal supplied with an input signal having a first amplitude lying in a range of a potential difference between the first and second potentials;
a converter having a current path connected at one end to said input terminal, for converting the input signal to an internal signal having a second amplitude smaller than the first amplitude;
a buffer having an output section and an input section connected to the other end of the current path of of said converter, for converting the internal signal to an output signal having substantially the same amplitude as the second amplitude;
compensation means having an input section and a current path connected at one end to a connection node between said converter and said buffer and connected at the other end to said third power source, for compensating the amplitude of the internal signal; and
an output terminal connected to the output section of said buffer.

7. An input circuit according to claim 6, wherein said compensation means has an input section connected between the output section of said buffer and said output terminal; and said converter has an input section connected to said third power source.

8. An input circuit according to claim 7, wherein said compensation means and said converter are formed of insulated gate FETs.

9. An input circuit according to claim 6, further comprising:
a first protection diode having a first diode current path connected at one end to a connection node between said input terminal and one end of the convertor current path and connected at the other end to said first power source; and
a second protection diode having a second diode current path connected at one end to said second power source and connected at the other end to a connection node between said input terminal and said one end of the converter current path.

10. An input circuit according to claim 6, wherein said buffer includes a first switch having an input section connected to the other end of the current path of said converter and a current path connected at one end to said third power source and connected at the other end to said output terminal; and a second switch having an input section connected to the other end of the current path of said converter and a current path connected at one end to said second power source and connected at the other end to said output terminal; said second switch being set in the OFF or ON state when said first switch is set in the ON or OFF state, respectively.

11. An input circuit according to claim 10, wherein said first switch is formed of an insulated gate FET of a first conductivity type and said second switch is formed of an insulated gate FET of a second conductivity type.

12. An output circuit comprising:

a first power source for supplying a first potential;

a second power source for supplying a second potential lower than the first potential;

a third power source for supplying a third potential having a potential level between the first and second potentials;

an input terminal supplied with an input signal having a first amplitude lying in a range of a potential difference between the third and second potentials;

a buffer having an output section and an input section connected to said input terminal, for converting the input signal to an internal signal of a second amplitude which is substantially the same as the first amplitude;

pull-up means having an input section and a current path connected at one end to said first power source and connected at the other end to an output terminal, for pulling up the potential of said output terminal;

pull-down means having an input section and a current path connected at one end to said second power source and connected at the other end to said output terminal, for pulling down the potential of said output terminal;

a wiring for electrically connecting the output section of said buffer and the input section of said pull-down means to each other;

level shifting means having an input section connected to the output section of said buffer, an output section connected to the input section of said pull-up means and a current path connected at one end to said first power source and connected at the other end to said second power source, for shifting a peak potential value of the internal signal to a potential peak value between the first and third potentials;

said level shifting means including a first resistor having a current path connected at one end to said first power source and connected at the other end to the output section of said level shifting means;

said level shifting means including a first switch having an input section connected to the input section of said level shifting means and a current path connected at one end to said second power source and connected at the other end to the output section of said level shifting means;

output voltage compensating means having a current path connected at one end to said output terminal and connected at the other end to said first power source, for compensating an output voltage;

said buffer including a second switch having an input section connected to the input section of said buffer and a current path connected at one end to said third power source;

said buffer including a second resistor having a current path connected at one end to the other end of the current path of said second switch and connected at the other end to the output section of said buffer;

said buffer including a third switch having an input section connected to the input section of said buffer and a current path connected at one end to said second power source and connected at the other end to the output section of said buffer;

said second switch being set in one of OFF and ON states when said third switch is set in one of ON and OFF states, respectively;

said output voltage compensating means having an input section connected to a connection node between said second switch and said second resistor;

said output voltage compensating meads including voltage dividing means for dividing a potential difference between a potential of the input section of said output voltage compensating means and the potential of said first power source; and said output voltage compensating means including a fourth switch having an input section supplied with a potential derived by dividing the potential difference by said voltage dividing means and a current path connected at one end to said first power source and connected at the other end to said output terminal.

13. An output circuit according to claim 12, wherein said first resistor is formed of a passive element and said first switch is formed of a bipolar transistor.

14. An output circuit according to claim 12, wherein said pull-up means and said pull-down means are formed of bipolar transistors.

15. An output circuit according to claim 12, wherein said second switch is formed of an insulated gate FET of a first conductivity type and said third switch is formed of an insulated gate FET of a second conductivity type.

16. An output circuit according to claim 12, wherein said voltage dividing means includes a third resistor having a current path connected at one end to said first power source and connected at the other end to the input section of said fourth switch; and a fourth resistor having a current path connected at one end to the input section of said output voltage compensating means and connected at the other end to the input section of said fourth switch.

17. An output circuit according to claim 12, wherein a load is provided between the other end of the current path of said fourth switch and said output terminal.

18. An output circuit according to claim 17, wherein said load comprises a fifth switch, said fifth switch has an input section connected to said third power source and a current path connected at one end to the other end of the current path of said fourth switch and connected at the other end to said output terminal.

19. An output circuit according to claim 17, wherein said fifth switch is formed of an insulated gate FET.

* * * * *